United States Patent [19]

Yokoyama et al.

[11] 4,303,889

[45] Dec. 1, 1981

[54] FILTER CIRCUIT

[75] Inventors: Kenji Yokoyama; Masaru Ida, both of Hamamatsu, Japan

[73] Assignee: Nippon Gakki Seizo Kabushiki Kaisha, Hamamatsu, Japan

[21] Appl. No.: 100,051

[22] Filed: Dec. 4, 1979

[30] Foreign Application Priority Data

Dec. 29, 1978 [JP] Japan .............................. 53-179409

[51] Int. Cl.$^3$ .............................................. H03F 1/34
[52] U.S. Cl. ................................... 330/107; 330/109; 330/151
[58] Field of Search ............... 330/107, 109, 126, 151, 330/294

[56] References Cited

PUBLICATIONS

Natarajan et al., *Realisation of Transfer Function Using One Amplifier*, Sep. 18, 1969, pp. 458-460, Electronics Letters, vol. 5, No. 19.

Brandt, *Active Resonators Save Steps in Designing Active Filters*, Apr. 24, 1972, pp. 106-110, Electronics.

*Primary Examiner*—James B. Mullins
*Assistant Examiner*—Gene Wan
*Attorney, Agent, or Firm*—Frishauf, Holtz, Goodman & Woodward

[57] ABSTRACT

A filter circuit comprises an inverting amplifier, a first resistor connected between an input and output of the filter circuit, a second resistor connected between the input of filter circuit and an input of the inverting amplifier, a parallel combination of a third resistor and capacitor which is connected between the input and output of inverting amplifier, and a fourth resistor connected between the output of inverting amplifier and the output of filter circuit. The resistance values $R_1$ to $R_4$ of the first to fourth resistors are selected such that $R_1 \cdot R_3 = -R_2 \cdot R_4$, with the result that a DC component is blocked. The capacitance value of the capacitor connected in parallel with the third resistor may be small provided that the resistance value of the third resistor is large. The third resistor and capacitor define the low cutoff frequency of the filter circuit.

4 Claims, 6 Drawing Figures

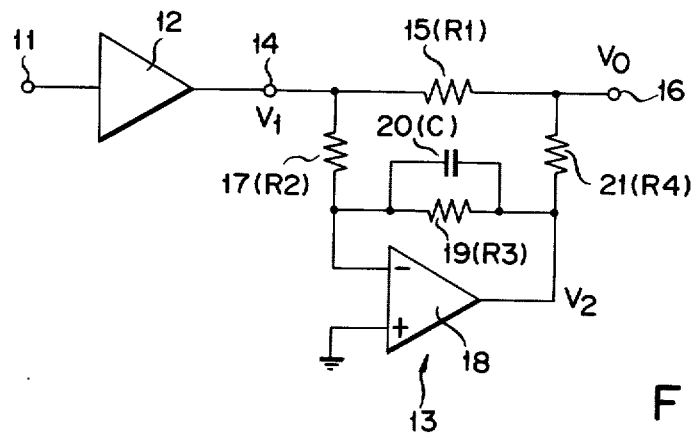
F I G. 3
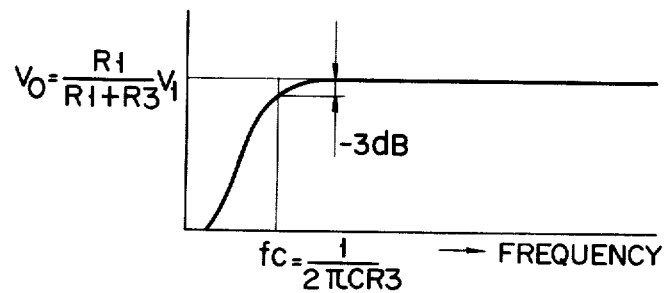
F I G. 4

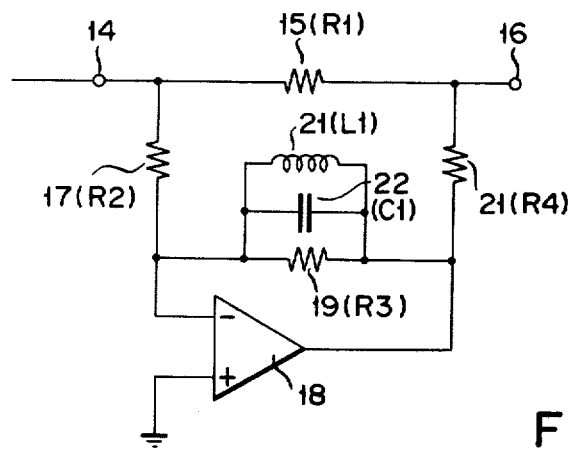
F I G. 5
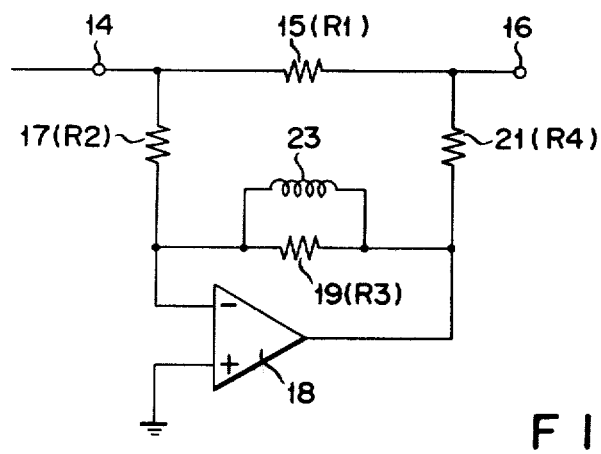
F I G. 6

4,303,889

FILTER CIRCUIT

BACKGROUND OF THE INVENTION

This invention relates to a filter circuit.

A conventional circuit as shown in FIG. 1 is primarily used to eliminate a DC component included in an output of an audio amplifier. In this circuit, a DC component included in an output of an amplifier 1 is blocked by a capacitor 2 to permit only an AC component to be supplied through an output terminal 3 to a load 4 such as a loudspeaker. When the impedance of the load 4 is low, it is necessary that the capacitance of capacitor 2 be made greater to assure a good low frequency response. It is therefore necessary to use a capacitor of larger size. However, a large-capacitance and large-sized capacitor is poor in its electrical performance.

FIG. 2 shows a highpass filter circuit. Even in this circuit a capacitor 5 of greater capacitance is necessary to permit a signal of very low frequency to be passed.

SUMMARY OF THE INVENTION

It is accordingly an object of this invention to provide a filter circuit which can block a DC component, while assuring a good low frequency response in spite of the use of a capacitor of smaller capacitance.

A filter circuit of this invention comprises an inverting amplifier, a first circuit connected between an input and output of the filter, a second circuit connected between the input of the filter and an input of the inverting amplifier, a third circuit connected between the input and output of the inverting amplifier, and a fourth circuit connected between the output of the inverting amplifier and the output of the filter. The first to fourth circuits have such impedances $Z_1$ to $Z_4$, respectively, that the relationship $Z_1 \cdot Z_3 = Z_2 \cdot Z_4$ is established with respect to a specific frequency.

Each of the first, second and fourth circuits may comprise a resistor and the third circuit a parallel combination of a resistor and capacitor. The resistors of the first through fourth circuits have such resistance values $R_1$, $R_2$, $R_3$ and $R_4$ that $R_1 \cdot R_3 = R_2 \cdot R_4$.

BRIEF DESCRIPTION OF THE DRAWINGS

FIG. 3 shows a filter circuit according to one embodiment of this invention;

FIG. 4 shows the frequency response characteristic of the filter circuit of FIG. 3; and FIGS. 5 and 6 show circuit diagrams of modifications of this invention.

DESCRIPTION OF THE PREFERRED EMBODIMENTS

Figure 1:
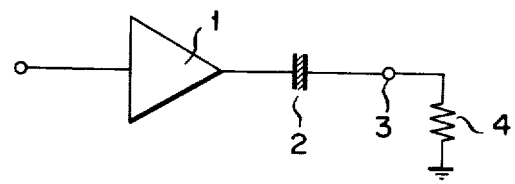
FIG. 1 shows a conventional circuit for eliminating a DC component.
Figure 2:
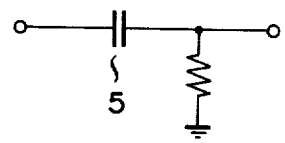
FIG. 2 is circuit diagram of a conventional highpass filter.

FIG. 3 shows a highpass filter circuit according to this invention which eliminates a DC output component of an amplifier. A terminal 11 for receiving an input signal is connected to an input of an amplifier 12 and an output of the amplifier 12 is connected to an input terminal 14 of a highpass filter circuit 13. The input terminal 14 is connected to an output terminal 16 of the filter circuit 13 through a resistor 15 (a resistance value $R_1$). The input terminal 14 is also connected to an inverting input of an operational amplifier 18 through a resistor 17 (a resistance value $R_2$). A noninverting input of the operational amplifier 18 is connected to ground. As a result, the operational amplifier 18 acts as an inverting amplifier. A parallel combination of a resistor 19 (a resistance value $R_3$) and capacitor 20 (a capacitance value C) is connected between the input and output of the operational amplifier. The output of the operational amplifier 18 is connected to the output terminal 16 through a resistor 21 (a resistance value $R_4$).

The resistive value $R_1$, $R_2$, $R_3$ and $R_4$ of the resistors 15, 17, 19 and 21 are so selected that the following equation is established.

$$R_1 \cdot R_3 = R_2 \cdot R_4 \qquad (1)$$

The amplifier 12 is an amplifier which has a DC output or a DC potential on the output terminal thereof, while the amplifier 18 is an amplifier which has no substantial output offset.

With the above-mentioned circuit the following equations are established.

$$V_2 = -\frac{R_3}{R_2} \cdot V_1 \qquad (2)$$

$$V_0 = \frac{V_1 \cdot R_4 + V_2 \cdot R_1}{R_1 + R_2} \qquad (3)$$

where
$V_1$: DC voltage on the input terminal 14
$V_2$: output DC voltage of the operational amplifier 18
$V_0$: DC voltage on the output terminal 16.

Substituting Equation (2) into Equation (3) yields $$V_0 = \frac{V_1(R_2 \cdot R_4 - R_1 \cdot R_3)}{R_2(R_1 + R_4)} \qquad (4)$$

Substitution in Equation (4) of Equation (1) leads to $$V_0 = 0 \qquad (5)$$

That is, with the circuit of FIG. 3 it is possible to completely eliminate a DC component at the output 16 of the filter circuit 13.

The operation of the FIG. 3 circuit will be explained below in connection with an AC signal component.

The operational amplifier 18, resistors 17, 19 and capacitor 20 constitute an integrating circuit which amplifies only a low frequency component on the input terminal 14 and eliminates a high frequency component. The cutoff frequency fc is given by $$fc = \frac{1}{2\pi C \cdot R_3} \qquad (6)$$

With the circuit shown in FIG. 3, $V_0 = 0$ when the frequency of the input signal is zero, $V_0 \approx 0$ when the input signal frequency is very low, and $$V_0 = \frac{R_4}{R_1 + R_4} \cdot V_1$$

due to $V_2 = 0$, when the input signal frequency is higher than the cutoff frequency fc. In consequence, the circuit of FIG. 3 has such a frequency response characteristic as shown in FIG. 4.

As evident from Equation (6), the cutoff frequency fc can be made sufficiently lower in spite of a smaller capacitance value C of the capacitor 20, if the resistance value $R_3$ of the resistor 19 is made greater. If the resistance values of the resistors 15 and 21 are selected such that $R_1 < R_4$ the insertion loss of the filter circuit can be suppressed to a fairly low level with respect to a high frequency range.

In the circuit of FIG. 3 a parallel resonant circuit comprised of an inductor 21 (an inductance value $L_1$) and capacitor 22 (a capacitance value $C_1$) may be connected in parallel with, as shown in FIG. 5, the resistor 19 in place of the capacitor 20. In this circuit, only a signal of the frequency $$\frac{1}{2\pi \sqrt{L_1 \cdot C_1}}$$

is eliminated.

In the circuit of FIG. 3 the capacitor 20 can be replaced by an inductor 23 as shown in FIG. 6. In this case, a lowpass filter circuit can be implemented contrary to the circuit of FIG. 3.

What we claim is:

1. A filter circuit having an input and an output, comprising:

an inverting amplifier having an input and an output;
   a first resistor connected between an input and an output of said filter circuit and having a resistance $R_1$;
   a second resistor connected between said input of said filter circuit and said input of said inverting amplifier and having a resistance $R_2$;
   a third circuit connected between said input and output of said inverting amplifier, said third circuit comprising a parallel combination of a third resistor having a resistor value $R_3$ and a capacitor; and
   a fourth resistor connected between said output of said inverting amplifier and said output of said filter circuit and having a resistance $R_4$;
   said resistance values $R_1$ to $R_4$ of said first to fourth resistors being selected such that $$R_1 \cdot R_3 = R_2 \cdot R_4.$$

2. A filter circuit having an input and an output, comprising:

an inverting amplifier having an input and an output;
   a first resistor connected between an input and an output of said filter circuit and having a resistance $R_1$;
   a second resistor connected between said input of said filter circuit and said input of said inverting amplifier and having a resistance $R_2$;
   a third circuit connected between said input and output of said inverting amplifier, said third circuit comprising a parallel combination of a capacitor, an inductor and a third resistor having a resistance value $R_3$; and
   a fourth resistor connected between said output of said inverting amplifier and said output of said filter circuit and having a resistance $R_4$;
   said resistance values $R_1$ to $R_4$ of said first to fourth resistors being selected such that $$R_1 \cdot R_3 = R_2 \cdot R_4.$$

3. A filter circuit having an input and an output, comprising:

an inverting amplifier having an input and an output;
   a first resistor connected between an input and an output of said filter circuit and having a resistance $R_1$;
   a second resistor connected between said input of said filter circuit and said input of said inverting amplifier and having a resistance $R_2$;
   a third circuit connected between said input and output of said inverting amplifier, said third circuit comprising a parallel combination of an inductor and a third resistor having a resistance value $R_3$; and
   a fourth resistor connected between said output of said inverting amplifier and said output of said filter circuit and having a resistance $R_4$;
   said resistance values $R_1$ to $R_4$ of said first to fourth resistors being selected such that $$R_1 \cdot R_3 = R_2 \cdot R_4.$$

4. The filter circuit of any one of claims 1, 2 or 3, wherein said inverting amplifier is comprised of an operational amplifier.

* * * * *